United States Patent [19]
Yang et al.

[11] Patent Number: 5,274,371
[45] Date of Patent: Dec. 28, 1993

[54] EXTENDED TIME-SHARED SCANNING KEYBOARD INTERFACE

[75] Inventors: Huei-Ming Yang, Tainan; Yang-Chern Chen, Hsin Chu, both of China

[73] Assignee: Industrial Technology Research Institute, Taiwan, China

[21] Appl. No.: 646,943

[22] Filed: Jan. 29, 1991

[51] Int. Cl.⁵ .......................................... H03M 11/20
[52] U.S. Cl. ........................................ 341/26; 341/22
[58] Field of Search .................................. 341/22, 26

[56] References Cited

U.S. PATENT DOCUMENTS

| | | | |
|---|---|---|---|
| 4,231,024 | 10/1980 | Munetsugu | 341/26 |
| 4,570,154 | 2/1986 | Kinghorn et al. | 341/26 |
| 4,673,933 | 6/1987 | Baver | 341/22 |
| 4,906,993 | 3/1990 | Freeman et al. | 341/26 |

*Primary Examiner*—Donald J. Yusko
*Assistant Examiner*—Michael Horabik
*Attorney, Agent, or Firm*—Darby & Darby

[57] ABSTRACT

A time-shared scanning technique is employed to detect the maximum keys with a keyboard interface. A detecting signal is transmitted, in turn, to the keyboard interface ports in consecutive clock phases. Since every keyboard interface port is independent of each other port, each can detect and record the status of the keyboard except when activated by the detecting signal to transmit a scanning signal utilized to scan all of the other ports. The number of keys that can be detected by the present keyboard interface is about twice that of the conventional keyboard interface.

2 Claims, 4 Drawing Sheets

EXTENDED TIME-SHARED SCANNING KEYBOARD INTERFACE

FIELD OF THE INVENTION

The present invention relates generally to keyboards of the type used widely to communicate with computerized systems and, more particularly, concerns a time-shared keyboard interface which achieves highly efficient scanning of keys.

BACKGROUND OF THE INVENTION

In telephone systems, the keyboard interface is conventionally arrayed in a key matrix comprising a column group and a row group. Each key is mapped to an intersection between one column and one row. Generally, the various known scanning methods could be classified into two different types.

In discussing keyboard scanning by keyboard interfaces reference will be made to "output ports" and "input ports". Output ports will be understood to be those through which the state of a key will actually be sensed (e.g. by transmitting a signal related to the state of a key). Each input port will typically be connected to a plurality of keys (e.g. each in a different column) and a scan signal transmitted by the output nodes will select one of them by selecting, e.g., the column being scanned and, therefore, the particular key corresponding to each input node for that column.

In a first type of keyboard interface, the keyboard interface ports are divided into two groups, a column group and a row group. If the column group of the keyboard interface ports is always assigned as input ports and the row group is always assigned as output ports, when the row group (output ports) transmits a scanning signal, the column group (input ports) will be scanned and detected by the scanning signal coming from row group (output ports) and the status of keyboard will be recorded accordingly.

In the second type of keyboard interface, the Column group and the row group of the keyboard interface are interchanged as input ports and output ports, respectively. This means that when the column group transmits the scanning signal (the column group is assigned as output ports at this moment), the row group will automatically become input ports which will be scanned by the signal coming from output ports, and the status of input ports is therefore detected. If the row group are assigned as output ports which transmit the scanning signal, the column group will become input ports to take charge of the detecting task. Such interaction completes the keyboard detecting operation.

Assuming that there are N keyboard interface ports in above mentioned two types of scanning keyboard interfaces, the maximum number of keys that can be arranged on the keyboard is only $N^2/4$ (if N is an odd number) or $(N^2-1)/4$ (if N is an even number). Therefore, the relatively small number of keys that can be detected is a disadvantage of the conventional keyboard interface.

Theoretically, for a keyboard interface with N interface ports, the maximum number of detected keys formed on a keyboard will be equal to the number of combinations of N objects taken two at a time, $C(N,2)$ (i.e. $N(N-1)/2$). The extended time-shared scanning technique of the present invention achieves this objective. Instead of assigning keyboard interface ports with the fixed duty of input ports and output ports for the column group and row group, respectively (as in the first type keyboard interface described previously), or interchanging input ports and output ports for the column group and row group (as in the second type keyboard interface described previously), in our invention, the time-shared scanning technique makes the interface ports absolutely independent of each other and they play the role of both input ports or output ports alternatively. By means of the time-shared scanning keyboard interface, the detecting signal is applied to scan each interface port sequentially in the process of scanning, making that port an output port. Each port is associated with a particular group (e.g. column) of keys as an output port. No matter which port is the output port, the rest of the ports (N−1 interface ports) will automatically become input ports, and each will be associated with one of the particular group of keys. Each input port then permits sensing and recording the status of the corresponding key. These scanning and detecting operations repeat in consecutive phases, with each port becoming an output port in turn and a corresponding, different group of keys being sensed by the remaining ports.

The architecture of the our invention, the improved keyboard interface combining the time-shared scanning technique and keyboard detecting concepts, maximizes the number of keys detected and results in efficient performance and cost reduction.

DETAILED DESCRIPTION OF THE PREFERRED EMBODIMENT

Figure 1:
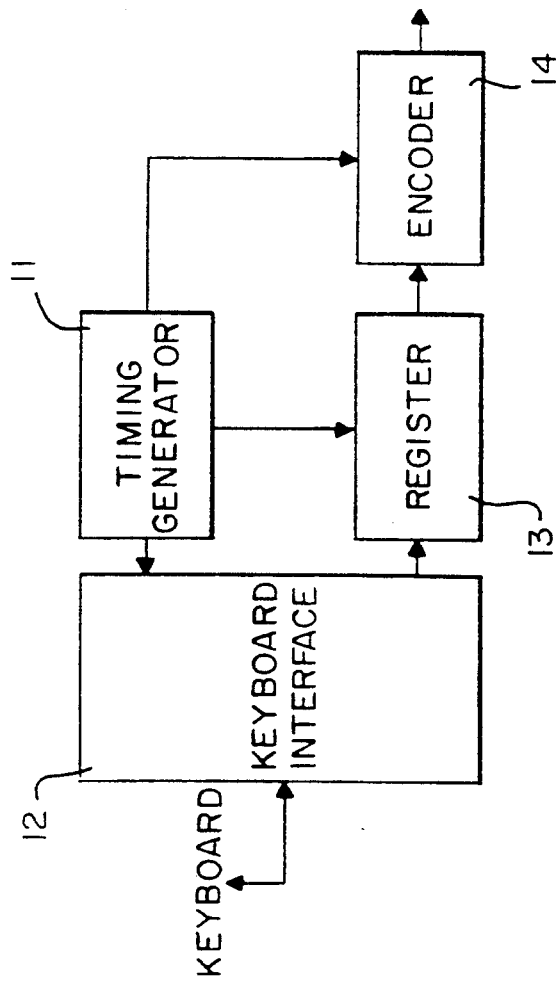
FIG. 1 is a block diagram of a keyboard scanning and detecting device embodying the invention.

The general use keyboard scanning and detecting circuit broadly comprises four parts (see FIG. 1):

1. A timing generator 11, which generates the detecting signal for keyboard interface 12 and the control signal for the register 13 and the encoder 14;

2. A keyboard interface 12, which is connected to the external keyboard, receives, from timing generator 11, the detecting signal used to scan the keyboard interface ports, and then transmits the status detected to register 13;

3. A register 13, which records the status from keyboard interface 12 and transmits it to encoder 14; and 4. An encoder 14, which encodes the status from Register 13 and then transmits it to the internal circuit.

Figure 2:
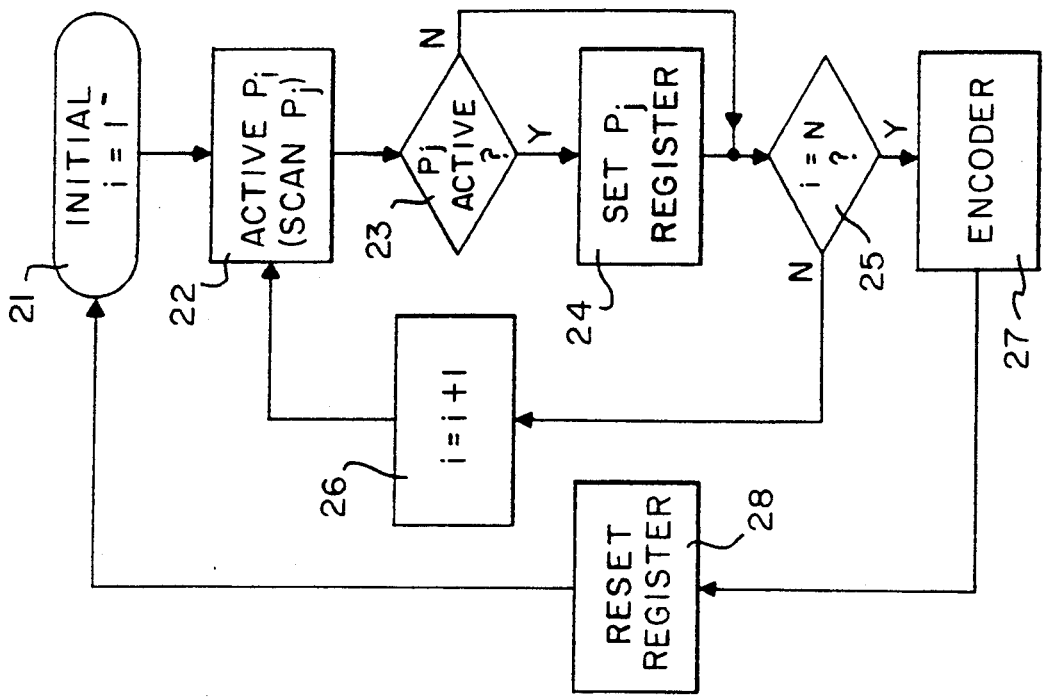
FIG. 2 is a state diagram of the extended time-sharing scanning keyboard interface of this invention.

To ensure that the innovation is completely understood, a detailed description in conjunction with the accompanying state chart (FIG. 2) is provided below.

Let us assume that a keyboard interface has N interface ports, $P_i$ represents one of these ports and state 21 represents the initial state and the ensuing operation starts from port 1. When $P_i$ transmits a scanning signal (State 22), $P_i$ then becomes an output port, and the rest of the ports $P_j (j \neq i)$ then become input ports in response to detection of the status of interface ports (state 23). If one or more of interface ports $P_j$ are active, this result will be recorded by register 13 (state 24). If no activation is detected, the Register will record nothing. The next scanning signal will be consecutively transmitted through the next port, which acts as P$_i$, following the pre-described route (state 26), until all the interface ports have transmitted a scanning signal (state 25). Next, the register transmits the status received to the encoder 14 for encoding, and operation is reset to the initial state (state 28). The whole cycle of the detecting and scanning operation is thereby completed.

Figure 3A:
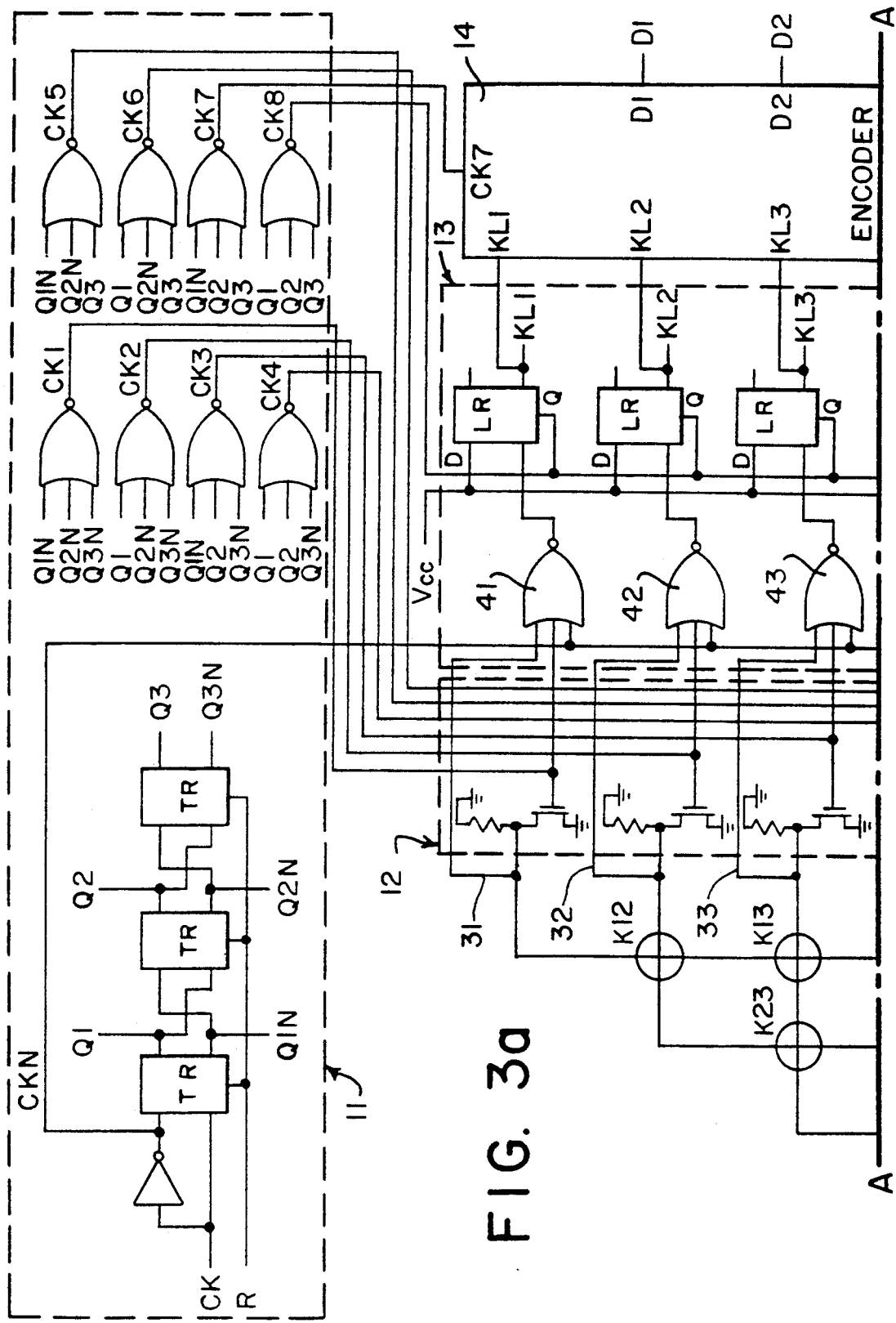
FIGS. 3a and 3b are a circuit schematic diagram showing six interface ports implemented by the present extended time-shared scanning keyboard interface.
Figure 3B:
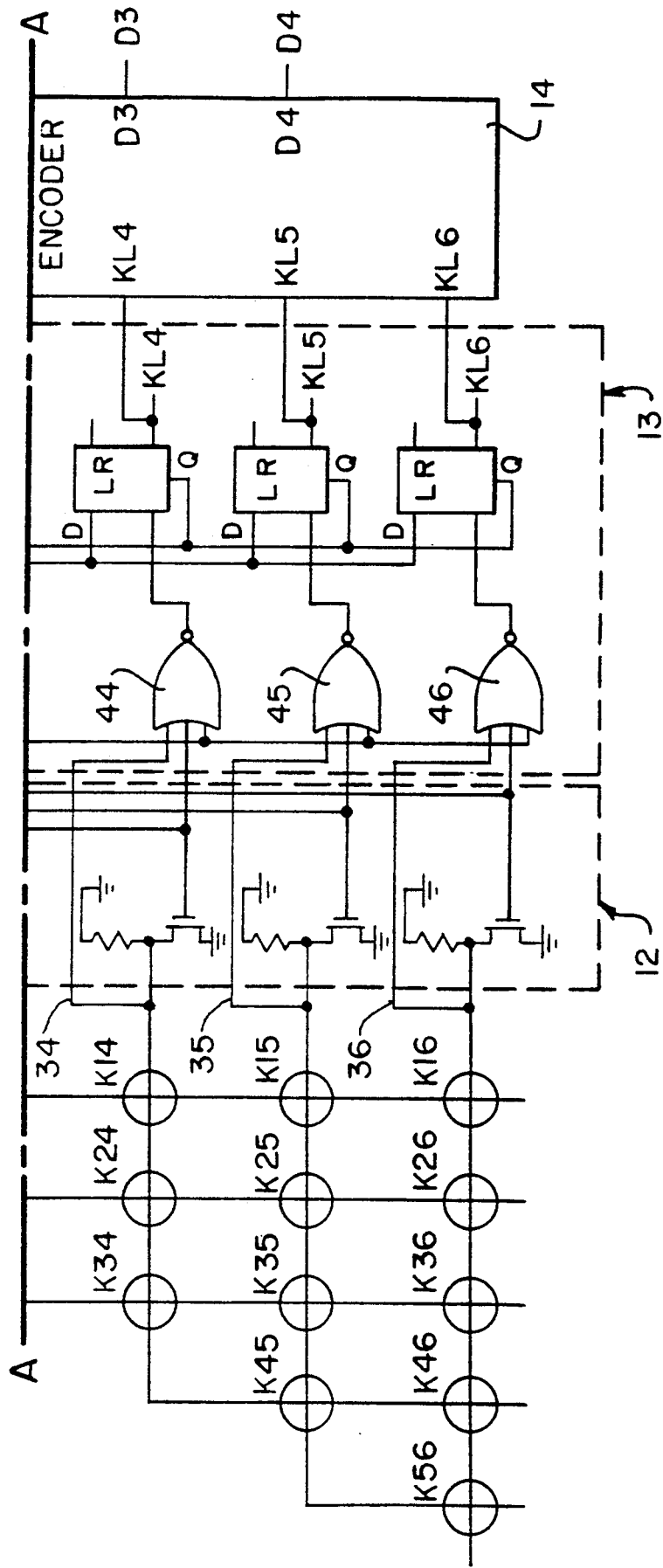
Figure 4:
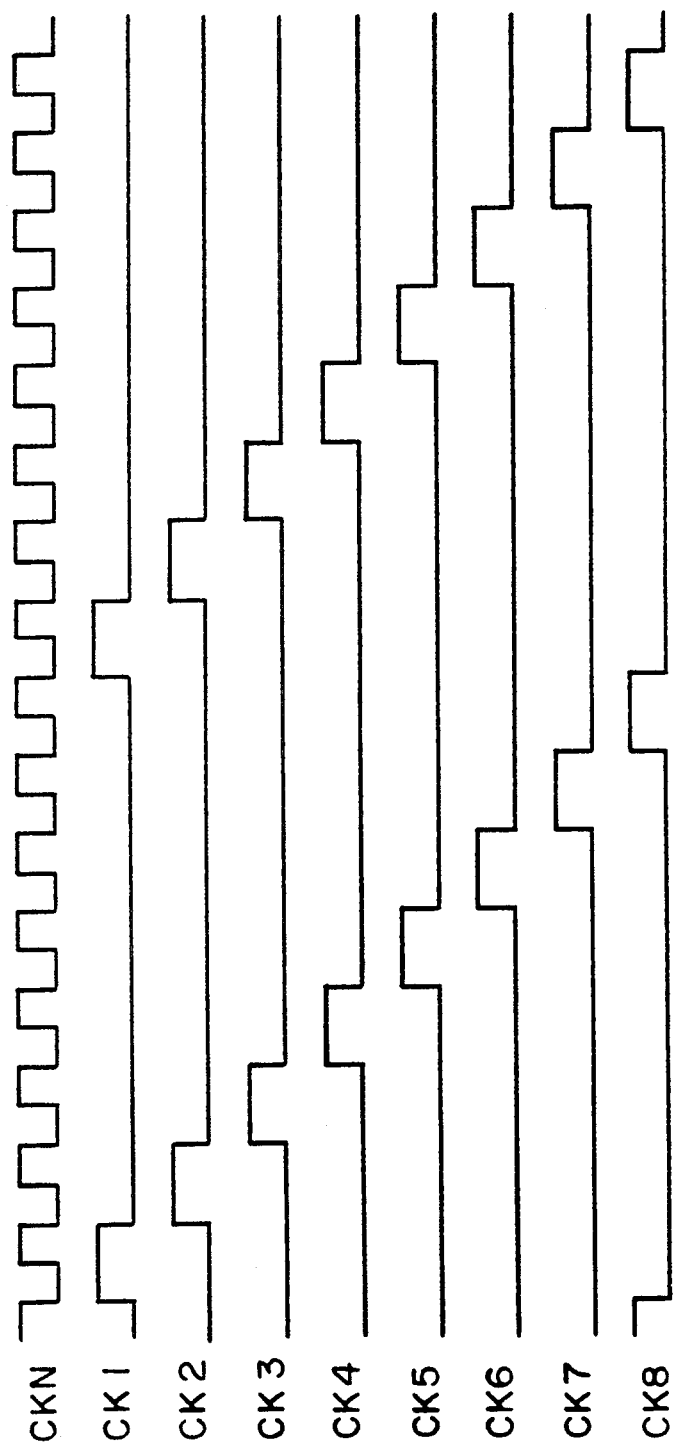
FIG. 4 is a timing diagram of the circuit of FIG. 3.
Figure 3A:
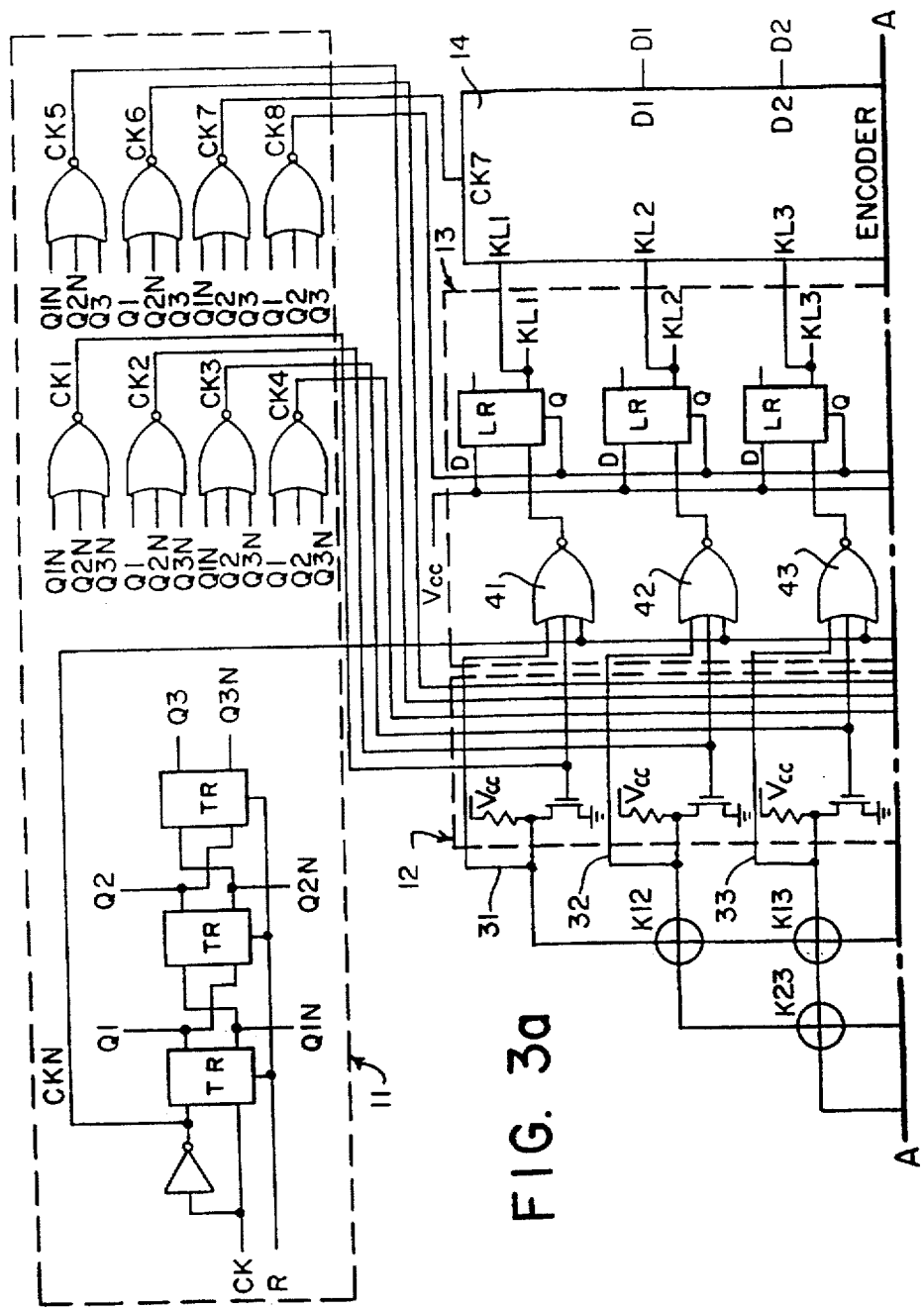
Figure 3B:
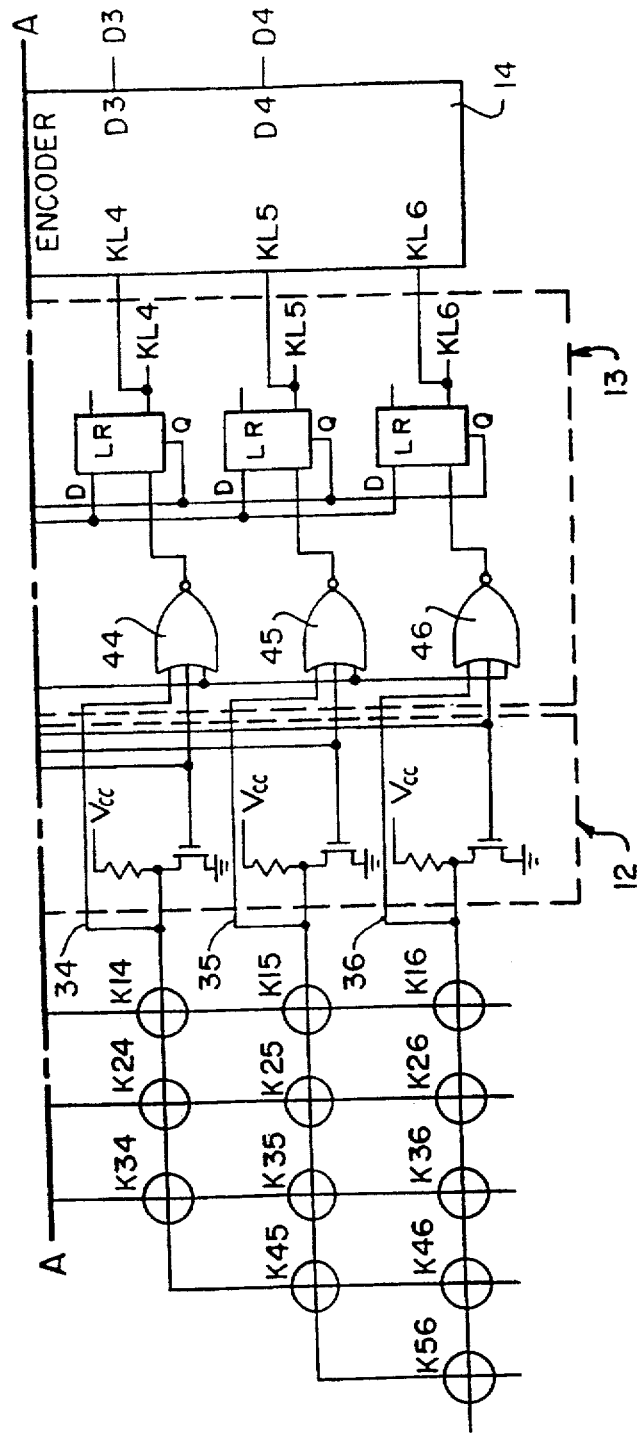

The circuit in FIGS. 3a and 3b which comprises six interface ports is implemented to illustrate the above-mentioned concept. The timing generator 11 which is composed of three flip-flops and eight 3-input NOR gates (refer to FIG. 1 and FIG. 3) forms eight timing signals named as CK1, CK2, CK3, CK4, CK5, CK6, CK7 and CK8 (refer to FIG. 4). The clock signals of CK1, CK2, CK3, CK4, CK5, CK6 are applied to the keyboard interface 12 for scanning the six interface ports. The clock signal CK7 is employed to control the Encoder 14, and the clock signal CK8 resets the register 13. The keyboard interface 12 has six ports, and each port contains a pulled-high series NMOS device with its source connected to ground. The gate node of each NMOS receives, respectively, the one of the clock signals CK1, CK2, CK3, CK4, CK5, CK6 generated by timing generator 11, and port 1, port 2, port 3, port 4, port 5 and port 6 appear at the respective drain nodes. A key K12 . . . K56 is arranged between each pair of ports, so a total of fifteen keys are on the keyboard.

Register 13 mainly comprises six flip-flop latch cells. All the D inputs of the latches are connected to the positive power supply Vcc. When a latch cell is latched, its output node Q will therefore be pulled to a high level. When the latch cell will be latched is controlled, respectively, by the 3-input NOR gates 41–46, the output of each of which is applied as a clocking input to a different latch. The signal CK8 is applied to the latches so as to produce a simultaneous reset of all the latches. Encoder 14 is under the control of the clock signal CK7. The outputs D1 to D4 of Encoder 14 are latched to the previous code unless the signal CK7 is active.

Now, the case of key K13 (arranged between port 1 and port 3) being depressed is taken as an example to illustrate the scanning and detecting principles. When key K13 is depressed, the following events occur.

When the clock signal CK1 is high (i.e. port 1 transmits the scanning signal), line 31 will be pulled low (because its NMOS is turned on) and at that moment, port 1 becomes an output port and the rest of the ports become input ports to receive the status of the scanned keyboard. If the key K13 is depressed, only line 33 will be low, but line 32, 34, 35, 36 are still high. Therefore, under the condition of the signal CKN being low, the output of Gate 43 is high and the other outputs of gates (gate 41, 42, 44, 45, 46) are low. Consequently, line KL3 will be set to the high level (i.e. line KL3=1), the lines KL1 through KL6 then represent the "001000" state.

When the clock signal CK2 goes high (i.e. port 2 transmits the scanning signal), line 32 is pulled low. However, the key K13 is not affected by port 2 now. Therefore, after scanning, line 31, 33, 34, 35, and 36 are still high, and the outputs of gates 41, 42, 43, 44, 45, and 46 are all low. No latching action is found and lines KL1–KL6 result in the "101000" state.

When the clock signal CK3 goes high (i.e., port 3 transmit the scanning signal), the procedure will be same as the clock signal CK1 being high, but the state of the result of lines KL1–KL6 comes out as the "101000" state. The situation of clock signals CK4, CK5, and CK6 being high will be the same as clock signal CK2, but the lines KL1–KL6 result in the "101000" state.

After the scanning operation of clock signals CK1, CK2, CK3, CK4, CK5 and CK6 is finished, the state of KL1–KL6 shown as the "101000" state represents the status of the depressed key K13 on the keyboard. After this, the encoder 14 will encode the state "101000" when the clock signal CK7 goes high. The register 13 will be reset (i.e. the state of lines KL1–KL6 becomes the "000000" state) when clock signal CK8 goes high. Now, the whole cycle of scanning and detecting operation has been completed.

The condition that no key is depressed or an incorrect key depression (for instance, that two keys are depressed simultaneously) will also be detected by the time-shared scanning keyboard interface. If the state of the lines KL1–KL6 in register 13 shows as "000000", it means that no key is depressed, or if the state of KL1–KL6 shows as "111000" or "101011" (more than three 1's appear) it indicates that multiple keys were depressed simultaneously. Under such situations, encoder 14 will encode nothing.

From the previous description, it should be understood that the objective of achieving the maximum number of keys detected can be accomplished by the utilization of the time-shared scanning and detecting technique.

Although preferred forms of the invention have been disclosed for illustrative purposes, those skilled in the art will appreciate that many additions, modifications, and substitutions are possible without departing from the scope and spirit of the invention as described in the accompanying claims.

I claim:

1. A time-shared scanning keyboard interface for a keyboard comprising:

timing generator means for sequentially generating a plurality of detecting signals, a first control signal, and a second control signal during a scanning cycle;

keyboard interface means containing N interface ports, each port being coupled to one of a plurality of keyboard interface elements, said interface elements being responsive to keyboard signals from said keyboard and also responsive to said detecting signals;

register means having N NOR gates coupled to N flip-flops for registering said keyboard signals and the status of said interface ports;

encoding means responsive to said first control signal for encoding said keyboard signal registered in said flip-flops;

wherein said interface ports respond sequentially to said detecting signals such that when one of said interface ports receives one of said detecting signals, said one of said interface ports will operate as an output port and the others of said interface ports that have not received said detecting signal will operate as input ports;

further wherein once said detecting signals have been generated during a scanning cycle, said timing generator means generates said first control signal such that said encoding means encodes said keyboard signals registered in said flip-flops, and then generates said second control signal to reset said flip-flops;

wherein each of said keyboard interface elements comprises a pulled-high series NMOS device with its source connected to ground, the gate receiving one of said detecting signals and the drain being one of said interface ports.

2. The scanning keyboard interface according to claim 1 wherein each of said NOR gates comprises three input nodes—a first input node for inputting said keyboard signal, a second input node for inputting said detecting signal, and a third input node for inputting a timing clock signal.

* * * * *

UNITED STATES PATENT AND TRADEMARK OFFICE
CERTIFICATE OF CORRECTION

PATENT NO. : 5,274,371  Page 1 of 3
DATED : December 28, 1993
INVENTOR(S) : Huei-Ming Yang; Yang-Chern Chen It is certified that error appears in the above-indentified patent and that said Letters Patent is hereby corrected as shown below:

Column 3, line 64, change "101000" to -- 001000 --.

Delete drawing Figs. 3a and 3b, and substitute therefor drawing Figs. 3a and 3b, as shown on the attached pages.

Signed and Sealed this

Twenty-ninth Day of April, 1997

Attest:

BRUCE LEHMAN

*Attesting Officer*  Commissioner of Patents and Trademarks